(12) United States Patent
van Hasselt

(10) Patent No.: US 7,383,688 B2
(45) Date of Patent: Jun. 10, 2008

(54) SUPERCONDUCTING DEVICE HAVING A CRYOGENIC SYSTEM AND A SUPERCONDUCTING SWITCH

(75) Inventor: Peter van Hasselt, Erlangen (DE)

(73) Assignee: Siemens Atkiengesellschaft, Munich (DE)

( * ) Notice: Subject to any disclaimer, the term of this patent is extended or adjusted under 35 U.S.C. 154(b) by 362 days.

(21) Appl. No.: 11/290,832

(22) Filed: Dec. 1, 2005

(65) Prior Publication Data

US 2007/0062203 A1 Mar. 22, 2007

(30) Foreign Application Priority Data

Dec. 1, 2004 (DE) .................. 10 2004 058 006

(51) Int. Cl.
*H01F 6/06* (2006.01)
*H01F 1/00* (2006.01)
*H01F 7/00* (2006.01)
*F25B 19/00* (2006.01)
*F17C 3/10* (2006.01)
*F28D 15/00* (2006.01)

(52) U.S. Cl. .................. 62/51.1; 62/48.2; 335/216; 505/211; 505/163; 165/104.21

(58) Field of Classification Search .............. 62/51.1, 62/48.2; 335/216; 505/211, 163; 165/104.21
See application file for complete search history.

(56) References Cited

U.S. PATENT DOCUMENTS

| 3,255,335 | A |   | 6/1966  | Kortelink |             |
|-----------|---|---|---------|-----------|-------------|
| 3,381,175 | A | * | 4/1968  | Brown et al. | 361/8    |
| 4,173,775 | A | * | 11/1979 | Kneip, Jr. | 361/141   |
| 4,602,231 | A |   | 7/1986  | Purcell et al. |         |
| 4,692,560 | A | * | 9/1987  | Hotta et al. | 174/15.4 |
| 4,904,970 | A | * | 2/1990  | Srivastava | 335/216  |
| 4,942,378 | A | * | 7/1990  | Barber | 505/211      |
| 5,847,633 | A | * | 12/1998 | Keller et al. | 335/216 |
| 6,442,949 | B1| * | 9/2002  | Laskaris et al. | 62/51.1 |
| 6,657,526 | B2|   | 12/2003 | Nagashima et al. |      |
| 2006/0048522 | A1| * | 3/2006 | Yamada | 62/6       |

FOREIGN PATENT DOCUMENTS

| DE | 102 21 693 | 6/2004 |
| EP | 0 074 030  | 3/1983 |
| EP | 0 014 766  | 5/1983 |

(Continued)

OTHER PUBLICATIONS

German Search Report Dated Sep. 5, 2005.

*Primary Examiner*—William C Doerrler
(74) *Attorney, Agent, or Firm*—Staas & Halsey LLP

(57) ABSTRACT

The superconducting device has a cryogenic system to whose first refrigerant there is thermally coupled a superconducting unit and a superconducting switching path, which is electrically connected to said unit and is to be activated thermally by a heater, of a superconducting switch. A first pipeline to whose end the superconducting switching path is thermally coupled is to be connected to a refrigerant space of the superconducting unit. In order to ensure reliable heating of the switching path upon activation of the heater, the first pipeline is to have a cross sectional constriction impeding the exchange of heat with the refrigerant space. Moreover, the switching path is to be thermally coupled to a comparatively higher temperature level via a further, closed pipeline with a second refrigerant.

19 Claims, 3 Drawing Sheets

FOREIGN PATENT DOCUMENTS

| | | |
|---|---|---|
| EP | 0 464 498 A2 | 1/1992 |
| EP | 0 740 314 A1 | 10/1996 |
| EP | 0 874 376 | 10/1998 |
| GB | 985378 A | 10/1965 |
| WO | WO 95/12968 A2 | 5/1995 |
| WO | 03/098645 | 11/2003 |

* cited by examiner

US 7,383,688 B2

SUPERCONDUCTING DEVICE HAVING A CRYOGENIC SYSTEM AND A SUPERCONDUCTING SWITCH

CROSS REFERENCE TO RELATED APPLICATIONS

This application is based on and hereby claims priority to German Application No. 10 2004 058 006.5 filed on Dec. 1, 2004, the contents of which are hereby incorporated by reference.

BACKGROUND OF THE INVENTION

The invention relates to a superconducting device having a cryogenic system to whose cryogenic medium to be cooled by a cooling plant are thermally coupled
- the superconductors of at least one superconducting unit and
- the superconducting switching path, electrically connected to these superconductors, of a superconducting switch, the superconducting switching path being assigned a heater for a controlled transition of the superconducting material of the switching path into the normally conducting state. A corresponding superconducting device having such a cryogenic system is to be gathered from EP 0 074 030 A2.

In the case of superconducting switches, the physical effect of the controllable transition from the superconducting into the normally conducting state can be used to implement a switching function, in particular in cases where no electrical isolation is required directly with the actual switching operation. Corresponding switches are used, in particular, in the field of NMR tomography (so-called "Magnetic Resonance Imaging [MRI]") for medical diagnostics as so-called permanent current or short-circuit switches for superconducting magnets. In order to be able to apply current to the superconducting field windings of such units/magnets, the bridging superconducting switching path of the short-circuit switch must be opened. In this case, the superconducting state can be cancelled by raising the temperature above the critical transition temperature, increasing the electric current density and/or increasing the magnetic field at the switching path. Corresponding switching paths of superconducting switches that are to be controlled thermally have been known for some time (compare the EP-A2 document mentioned at the beginning, or from U.S. Pat. No. 3,255,335 or U.S. Pat. No. 4,602,231 A).

The superconducting switch is usually located inside a cryogenic system with a cryogenic medium that is also used for cooling the superconductors of a superconducting unit such as, for example, a field winding (compare the EP-A2 document mentioned at the beginning). As a result, when in the warm normally conducting state the switch introduces a substantial quantity of heat into the cryogenic medium of the cryogenic system. This quantity of heat can amount to a few watts in a liquid helium (LHe) bath of an MRI magnet. Such an input of heat is very often unacceptable. Thus, for example, for known MRI magnet systems where the aim is the complete recondensation of vaporizing helium by a cold head of a cooling plant, it is necessary for the power dissipated at a helium reservoir during ramping, that is to say heating of the superconducting switching path, to be limited, for example, to a few 0.1 W. However, this is inconsistent with the abovementioned losses in the switch. This problem therefore particularly affects recondensing, closed cryogenic systems where the cooling power of a cold head of a cooling plant is furnished in the form of a so-called cryogenic cooler. Such cryogenic coolers are, in particular, of the Gifford McMahon or Stirling type, or are designed as so-called pulse tube coolers.

SUMMARY OF THE INVENTION

It is one possible object of the present invention to configure the superconducting device with the features mentioned at the beginning to the effect that it is possible to ensure a reliable switching function of the thermally activated switching path of the superconducting switch.

The inventor proposes a superconducting device. The aim is therefore that there is connected to a refrigerant space of the cryogenic medium, serving as first refrigerant, for cooling the superconductors of the at least one unit a first pipeline to whose end the switching path of the superconducting switch is thermally coupled, and that has a cross sectional constriction in such a way that the dissipated losses caused upon activation of the heater are greater than the cooling power made available by the cooling plant by the first refrigerant situated in the refrigerant space. Moreover, a further, closed pipeline is to be provided via which the switching path of the superconducting switch is thermally coupled to a higher temperature level that lies above the temperature level of the first refrigerant in the refrigerant space.

In the case of the cryogenic system of the superconducting device, the thermal coupling of the superconducting switch is firstly performed via the portion of the first refrigerant located in the first pipeline to the portion of this refrigerant cooling the superconductors of the superconducting unit. It is possible, on the one hand, in this case when there is a low dissipated power in the switch to implement cooling with very good coupling that is comparable with bath cooling. On the other hand, the cooling power that can be transferred to the switch can be effectively limited by selecting the cross section of the pipeline in the region of its constriction, this being done by reducing the heat flux from the activated, now resistive switching path into the refrigerant space connected to the first pipeline. It is possible in this way to implement keeping the switch in the normally conducting state with relatively low dissipated losses $U^2/R$ (where U=the voltage dropping across the switching path, which has become resistant, and the R=resistance thereof, which can be far below the watt range of known thermally switched switches, without an excessively large quantity of heat passing into the cold medium in the refrigerant piping system that is to be cooled down by a cooling plant. The excess power loss then present at the switch thus leads to a continuous heating of the switching path in the activated/resistive state.

Secondly, the switching path of the superconducting switch is coupled by the further pipeline to a temperature level that is higher than in the refrigerant space. It is also possible here to provide the higher temperature level of the cooling plant for cooling the first refrigerant, or a further cooling plant. As soon as the temperature of the switch reaches that of the upper end of the further pipeline, the second refrigerant is cooled starting from the higher temperature level. The temperature rise in the switch is thereby advantageously limited. The heat transferred from now to the higher temperature level must no longer be transferred to the reservoir of the first refrigerant during a later recooling. The higher temperature level must therefore be able to cool the switch losses minus the power transferred to the reservoir of the first refrigerant, and thus advantageously requires only a cooling power of a few voltage watts.

The advantages attending this refinement are to be seen, in particular, in that the temperature of a superconducting switch, cooled via the first refrigerant, of a superconducting unit can be stabilized with the aid of a second refrigerant such that although this temperature lies above the critical temperature of the material of the superconducting switching path it cannot rise substantially there above. Specifically, a temperature rise to a substantially higher temperature level would require correspondingly long recooling times, since the recooling below the triple point of the second refrigerant in the further pipeline is performed only by the limited transfer of heat to the reservoir of the first refrigerant. Thus, it is possible to ensure a reliable switching state with both measures, and in so doing to limit the required cooling power of the cryogenic system or of its cooling plant.

A circulation of the second refrigerant based on a thermosiphon effect is to be preferably set up in the further pipeline (cf. e.g. WO 03/098645 A1). Here, in normal operation, that is to say with a closed switch or superconducting switching path, the thermosiphon does not operate since its lower end is at the switch temperature and its upper end at the raised temperature level. The second refrigerant introduced is then generally frozen out at the coldest point, that is to say in the region of the switch. With the opening of the switch, that is to say the activation of the switching path or its transition into the normally conducting state, and during ramping, the switch begins to heat up, since the heat dissipated in it exceeds the power that can be transferred via the first pipeline. When the triple point of the second refrigerant is reached in the further pipeline, this second refrigerant then melts. As soon as the temperature of the switch reaches that of the upper end of the further pipeline, the circulation of the second refrigerant in the further pipeline is stimulated because of the thermosiphon effect such that the second refrigerant is cooled starting from the higher temperature level. The targeted limitation of the temperature rise at the superconducting switching path can thus be ensured in a simple way.

Furthermore, the desired limitation of a heat flux into the first refrigerant in the refrigerant space can be implemented in general with the aid of a cross sectional area of the cross sectional constriction of between 0.5 mm$^2$ and 100 mm$^2$, preferably of between 7 mm$^2$ and 30 mm$^2$. On the one hand, this ensures a satisfactory cooling of the switching path without, on the other hand, too much heat passing into the refrigerant piping system. The cross sectional constriction should preferably be located in a part of the first pipeline facing the superconducting switch, in order to suppress an input of heat into relatively large portions of the first refrigerant.

The refrigerant space can advantageously be part of a refrigerant piping system with refrigerant paths on the or through the at least one superconducting unit. The required quantity of first refrigerant can thus be limited.

It can be advantageous in this case to provide a circulation of the first refrigerant in the refrigerant piping system and/or the first pipeline in accordance with the so-called thermosiphon effect.

The cooling power can preferably be introduced into the first refrigerant circulating in the refrigerant piping system by at least one cold head of the at least one cooling plant. Since the input of heat into the cryogenic medium is limited by the use of the pipeline plus constriction, it is possible to use cooling plants for limited cooling power.

Here, the further pipeline can be thermally coupled to a cooling stage of the cold head that is at a higher temperature level than the cooling stage provided for cooling the first refrigerant. Of course, it is also possible, too, to provide a further cold head of the cooling plant or a cooling plant dependent thereon in order to cool the second refrigerant in the further pipeline.

It is preferred to use hydrogen or neon as cryogenic media for the second refrigerant if the superconductor material used is so-called low-$T_c$ superconductor material (LTC superconductor material) that is to be cooled with helium. The use of hydrogen is to be regarded in this case as particularly advantageous since, at approximately 13.8 K, its triple point is only slightly higher than the transition temperature of known LTC superconductor materials. In general, there should be provided as second refrigerant one whose triple point is above the transition temperature of the superconducting material of the switching path.

The at least one superconducting unit and the superconducting switch can be arranged in a common vacuum chamber. Superconducting connecting leads can then advantageously run through the vacuum chamber between the switching path and the superconductors of the unit without especially complicated cooling measures.

The first refrigerant is generally helium. This medium is required, in particular whenever the superconducting paths of the superconducting device have LTC superconductor material. Of course, other cryogenic media can also be used when use is made of oxidic high $T_c$ superconductor material (HTC superconductor material), and use thereof at higher temperatures.

The superconducting switch can be designed in a way known per se as a permanent current switch or short-circuit switch. Corresponding switches are suitable, in particular, for continuous operation of superconducting field windings that do not require a permanent power supply from outside.

Appropriate field windings can preferably be those of an MRI magnet.

Other advantageous refinements of the superconducting device of the particularly configured cryogenic system follow.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
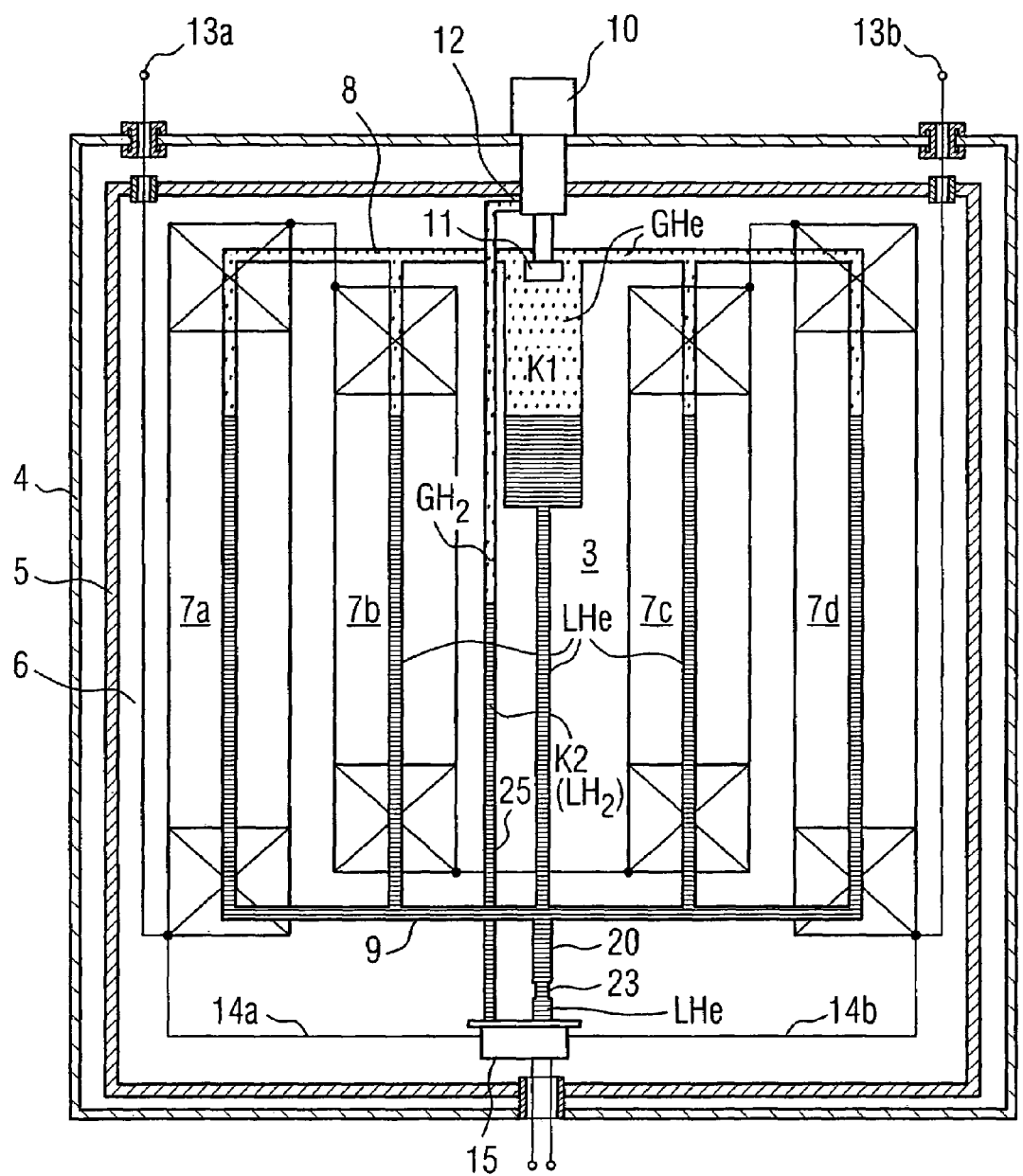
FIG. 1 of the drawing shows a highly schematic view of a longitudinal section through a superconducting device with a cryogenic system designed in accordance with one embodiment of the invention, FIG. 2 of the drawing shows a detailed view of the superconducting switch of the device according to FIG. 1, and FIGS. 3 and 4 of the drawing show diagrams of the losses dissipated in the switch as a function of the switch temperature.

Reference will now be made in detail to the preferred embodiments of the present invention, examples of which are illustrated in the accompanying drawings, wherein like reference numerals refer to like elements throughout.

Corresponding parts are provided with the same reference numerals in the figures.

The cryogenic system designed can be provided per se for any desired devices in superconducting technology that require at least one superconducting switch for the at least one superconducting unit thereof. The superconducting units or apparatuses can be, for example, a magnet, a machine or a transformer; a superconducting cable is also possible. The superconducting unit is preferably an MRI magnet or a corresponding magnet system that is to be short circuited for the operating state by at least one superconducting permanent current switch. The following may be taken to proceed from such an exemplary embodiment.

The superconducting device denoted in general by numeral 2 in FIG. 1 has a cryogenic system 3 with a cryostat 4. A radiation shield 5 for thermal insulation is present in the interior of the cryostat, in which a vacuum chamber 6 is constructed. Four superconducting magnets 7a to 7d of an MRI magnet system are accommodated in this vacuum chamber as superconducting units. In order to cool the superconductors of these magnets with the cryogenic medium—such as helium—regarded as a first refrigerant K1, a refrigerant piping system 8 is provided whose refrigerant paths run along or through the magnets. The piping system 8 comprises a refrigerant space 9 in which the first refrigerant collects after running through the magnets 7a to 7d at their underside. The first refrigerant can preferably flow in the refrigerant piping system 8 in accordance with the thermosiphon effect: that is to say a known bath cooling is dispensed with. To this end, the refrigerant K1 in the refrigerant piping system 8 is thermally coupled on its upper side to the lowermost (coldest) stage of a cold head 11 of a cooling plant 10, where gaseous helium GHe is (re)condensed to form liquid helium LHe. If appropriate, the piping system 8 can also be designed as a single-tube system in a way known per se (compare the abovementioned WO 03/098645 A1). Both the flow of the colder medium in the direction of the refrigerant space 9, and the backflow of the heated medium to the geodetically higher cold head 11 in the same pipe take place in such a piping system.

The ends of the electrically serially connected magnets 7a to 7d are connected via electric supply leads 13a and 13b to a current source located outside the cryostat. A thermal permanent current or short-circuit switch 15 known per se is connected between these supply leads of the current source inside the vacuum chamber 6 and is used to short circuit the series circuit of the superconducting magnets 7a to 7d. To this end, the switch 15 has a superconducting switching path 16 that, if required, can be brought from the superconducting into the normally conducting state by an electric heating element 17 that can be driven from outside, if required. For example, the switching path has a resistance R of 20 to 30 Ω in conjunction with a voltage drop U of approximately 10 V.

The switch 15 is not integrated directly in the refrigerant piping system 8 with the first refrigerant K1 in order to cool this switching path 16. Rather, a particular, first pipeline 20 is connected to the lower refrigerant space 9 of the piping system 8 via which the first refrigerant K1 can pass to the switch 15. The thermal coupling of the switch 15 to the lower, closed end of this pipeline 20 is served by a plate 21 made from a material that is a good conductor of heat such as, for example, Cu, and which is connected in a fashion that is electrically insulating but adequate in terms of thermal conduction to the interior of the switch 15, and thus to the switching path 16. For example, it is possible for this purpose to provide an adhesive bond 22 with the aid of a suitable epoxy resin adhesive such as, for example, that having the trade name "Stycast" (Emerson and Cuming, US) that must, moreover, have an adequate low temperature capability.

Figure 2:
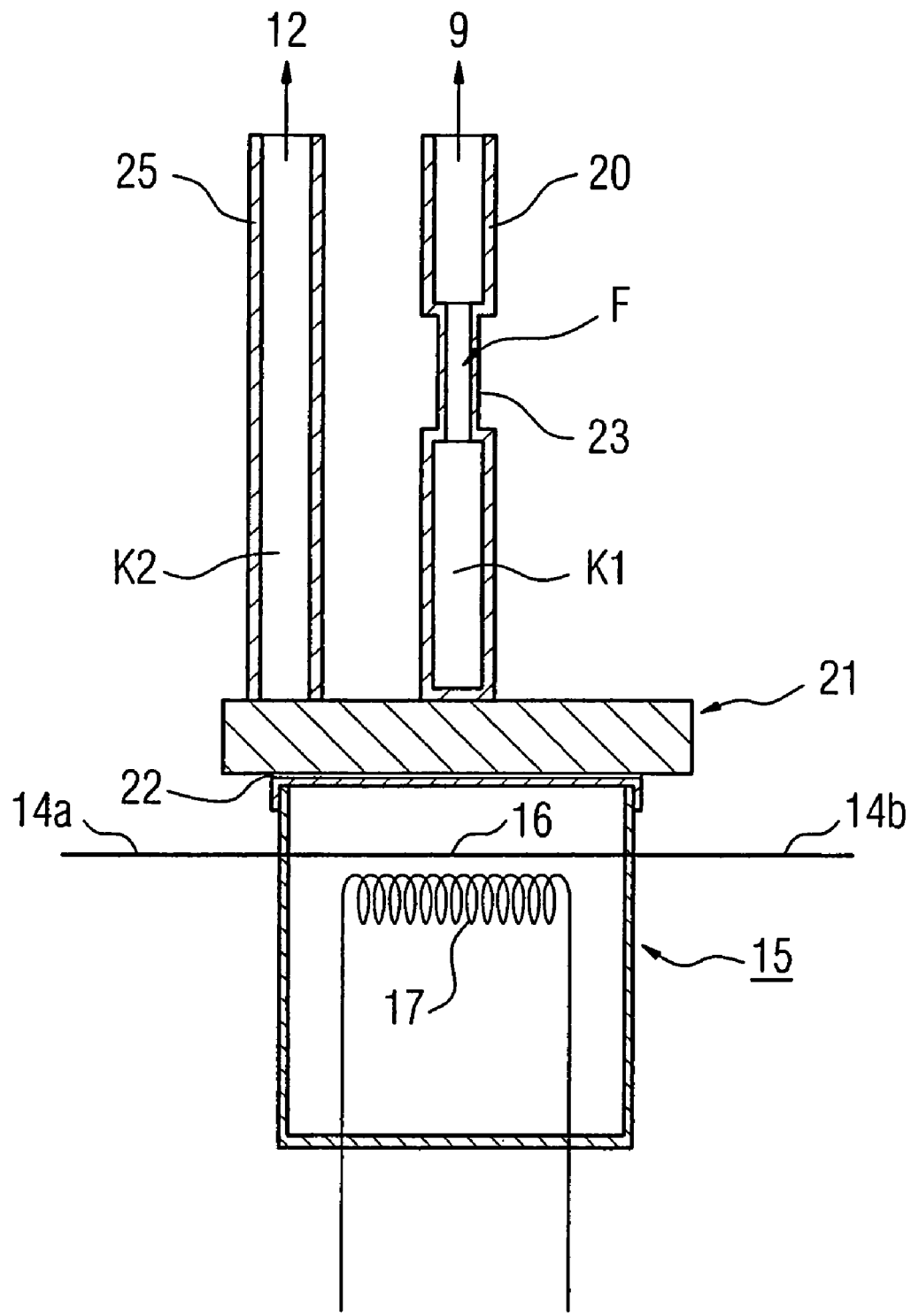

As may further be gathered from FIG. 2, in particular, the first pipeline 20 has a predetermined cross sectional constriction 23 between its end facing the Cu plate 21 and the refrigerant space 9. This cross sectional constriction is preferably provided in the lower half of the pipeline 20, facing the Cu plate 21. The cross sectional area F of this constriction 23 is intended here to be selected such that the heat flux W into the first refrigerant K1, which is located in the refrigerant space 9, represented by a line with an arrow can at least be limited. This means that upon activation of the heating element the dissipated power loss $U_2/R$ that is caused is to be greater than the cooling power made available via the first refrigerant located in the refrigerant space.

For known MRI magnet systems and thermal short circuit switches, the cross sectional constriction 23 has a diameter of the order of magnitude of between approximately 0.8 and 11.2 mm such that the cross sectional area F then comes to lie approximately between 0.5 mm$^2$ and 100 mm$^2$. It is preferred to select the area F to be between approximately 7 mm$^2$ and 30 mm$^2$, and the diameter to be between approximately 2 mm and 10 mm. It is possible in this way to keep the switch 15 with a dissipated power of the order of magnitude of only 0.1 W up to a few 0.1 W in the normal conducting state in conjunction with activation of its heating element 17 and/or by the heating power ($U^2/R_{normally\ con\text{-}ducting}$) occurring along the switching path. By this cross-sectional constriction, the required cooling power can be limited on the part of the refrigerant piping system 8 and thus the cooling plant 10 (so-called entrainment limit). The value of the cross sectional area F actually to be selected from these points of view can be determined in simple trials.

A further pipeline 25 is provided for the purpose of limiting the temperature rise in the superconducting switch 15 when it is opened, or in order to maintain the normally conducting resistance in the switching path 16 and, associated therewith, excessively long recooling times for switch closure. This pipeline thermally couples a switch in the region of the Cu plate 21 to a higher temperature level of the cooling plant 10 that is above the temperature level of the first refrigerant K1 in the refrigerant space 9. To this end, the further pipeline 25 is, for example, connected thermally to a second stage 12 of the cold head 11 of the cooling plant 10 that can also be used, for example, to cool the radiation shield 5, and is thus at a higher temperature level than that of the temperature level at the lower end of the cold head 11. For example, this stage 12 is at a temperature level of between 15 to 30 K. However, instead of this it is possible, if appropriate, to provide an additional cold head of a lower cooling power of a few watts at approximately 15 to 30 K. There is to be located in the further pipeline 25 a second refrigerant K2 that is preferably frozen out at the operating temperature of the superconducting switching path 16, that is to say in the superconducting state thereof, at least at the coldest point, that is to say in the region of the switch 15. Consequently, within the scope of the selected exemplary embodiment hydrogen or, if appropriate, neon serves as second refrigerant K2. The switch begins to heat up upon being opened or upon activation of the heating element 17 in order to bring the superconducting switching path 16 from the superconducting into the normally conducting state, the so called ramping. This is to be ensured whenever the heat dissipated in the switch exceeds the cooling power that is to be transferred in the pipeline 20 by the first thermosiphon of the first refrigerant K1. When the triple point of the second refrigerant K2, 13.8 K when use is made of hydrogen, is reached, the refrigerant melts and as a result the circulation is stimulated in the further pipeline 25 by exploiting a thermosiphon effect. As soon as the temperature of the switch has reached that of the upper end of the further pipeline at the cooling stage 12, this circulation begins, and so cooling power is then output from the cooling stage 12 to the second refrigerant. A further temperature rise of the switch is advantageously limited thereby. This state is assumed in the illustration of FIG. 1, where for hydrogen as refrigerant K2 used by way of example the liquid aggregate state thereof is denoted by $LH_2$ and whose gaseous aggregate state is denoted by $GH_2$.

In order to suppress an excessively large heat transfer from the switch 15 into the cooling plant 10 via the further pipeline 25, this pipeline should advantageously be designed to conduct heat poorly, at least in parts.

Figure 3:
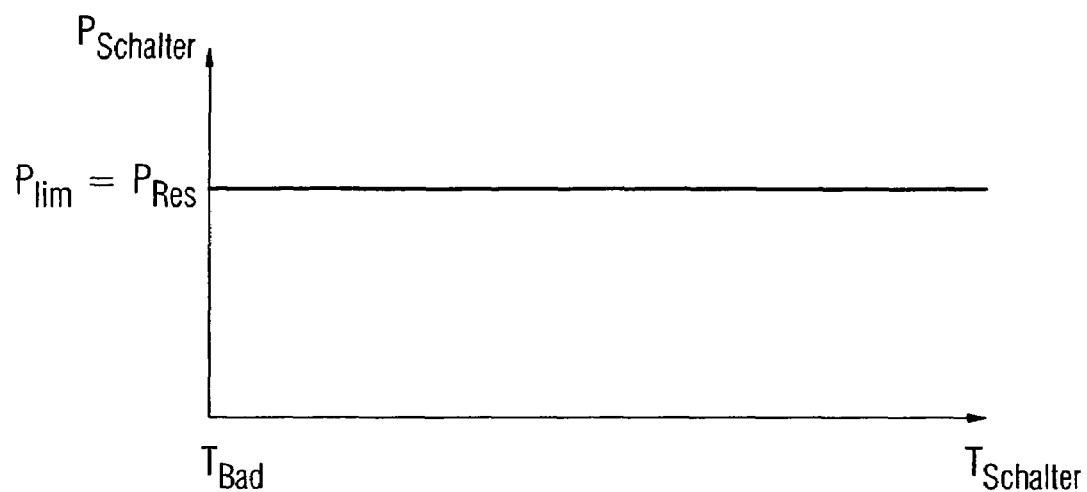
Figure 4:
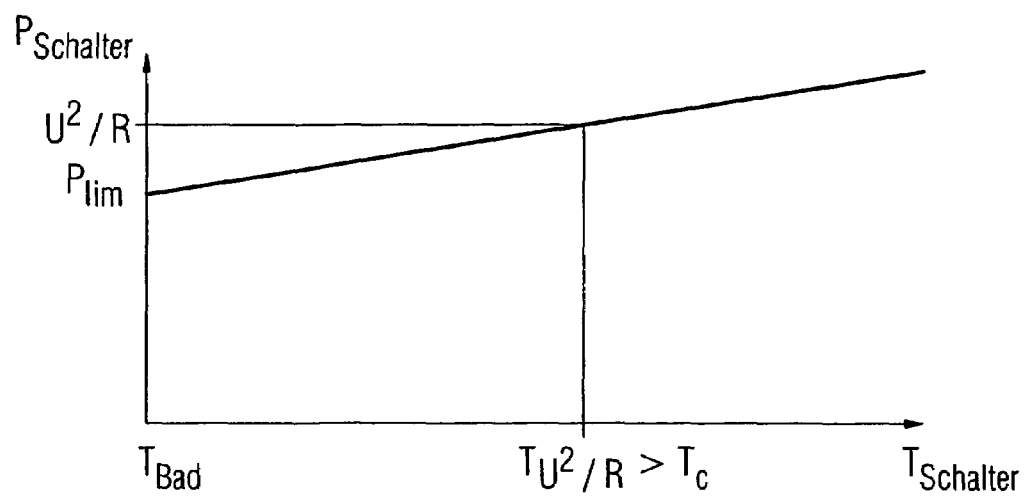

The two fundamentally different cases are to be distinguished for dimensioning the abovementioned entrainment limits in the first thermosiphon pipeline 20:

a) The losses $U^2/R$ dissipated in the switch 15 during the open state are greater than the cooling power $P_{Res}$ available on the part of the cooling plant 10. In this case, the thermosiphon is intended to limit the power transferred to the liquid refrigerant K1 to a maximum of $P_{Res}$ (compare the diagram of FIG. 3). If no further thermal connections are present between the switch 15 and the refrigerant K1 in the refrigerant space 9, or are of negligibly small dimensions, the excess power loss again leads to continuous heating of the switch in the open state. Such an undesired heating can, however, advantageously be limited with the aid of the thermosiphon in the further pipeline 25.

b) The losses $U^2/R$ dissipated in the switch 15 during the open state are smaller than the cooling power $P_{Res}$ available on the part of the cooling plant 10:

in this case it is advantageous to design the thermosiphon of the first pipeline 20 such that the maximum power that can be transferred by liquid convection is somewhat below the losses $U^2/R$ dissipated in the switch, for example being 30 to 95%. The use of an additional, purely conducting path between the switch 15 the liquid refrigerant K1 causes a change in the transfer characteristic specified under a) in accordance with the illustration of the diagram in FIG. 4. This permits the stable operation of the switch in the open state (that is to say above the transition temperature $T_c$ of the superconductor material) through the thermal losses normally occurring in it in the open state. In the case of powers below $P_{lim}$, the switch is cooled as effectively as with a known direct bath cooling by the refrigerant K1.

In order to permit a quicker recooling time, the switch temperature $T_{U^2/R}$ should only be slightly below the critical temperature $T_c$. To this end, the second pipeline 25 is advantageously provided with the thermosiphon of the second refrigerant K2. In this way, the thermal mass of the switch can be reduced substantially by comparison with customary designs.

It has been assumed in the case of the exemplary embodiment adopted above that the superconductors of the superconducting device 2 with its magnets 7a to 7d are to be cooled by a refrigerant piping system 8 in which, if appropriate, the first refrigerant K1 circulates in accordance with the thermosiphon effect. Of course, other types of cooling are also suitable in order to keep the conductors below the critical transition temperature of their superconducting material. Thus, it is also possible to provide bath cooling, for example, to this end.

Of course, the above described cryogenic system of a superconducting device can also be used for superconducting units whose conductors permit cooling at higher temperatures than those of the LHe. What can be involved here, in particular, are conductors having so-called high $T_c$ superconductor material whose critical transition temperature is above 77 K, the boiling point of the $LN_2$. A corresponding material is then to be selected for the superconducting switching path of the switch. The second refrigerant K2 would then need to be selected as one whose triple point is above the transition temperature of the superconducting material used. However, it is also conceivable that use would be made to this end of another superconductor material having a different critical transition temperature.

Furthermore, it has been assumed that the at least one superconducting unit is a magnet of an MRI installation. Of course, it can also be the magnet of a beam guidance installation or an energy storage installation. Since the superconducting switch need not necessarily be a short-circuit switch for a corresponding magnet, the superconducting unit can also be the winding of a transformer or of an electric machine, or be a section of a cable.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

What is claimed is:

1. A superconducting device having a cryogenic system with a medium cooled by a cooling plant thermally coupled to the cryogenic medium, the superconducting device comprising:

superconductors of at least one superconducting unit;
a superconducting switch;
a superconducting switching path formed of a superconducting material, to electrically connect the superconductors to the superconducting switch; and
a heater assigned to the superconducting switching path for a controlled transition of the superconducting material of the switching path into the normally conducting state;

the superconducting switching path comprising:

a first pipeline connected to a refrigerant space for a first refrigerant cryogenic medium, to cool the superconductors of the at least one unit, the first pipeline having an end thermally coupled to the switching path, the first pipeline having a cross sectional constriction between the cooling plant and the switching path such that dissipated losses caused upon activation of the heater are greater than the cooling power delivered from the cooling plant by the first refrigerant; and a second pipeline thermally coupled to the switching path of the superconducting switch, the second pipeline providing cooling to a temperature above the temperature of the first refrigerant in the first pipeline.

2. The device as claimed in claim 1, wherein a second refrigerant is circulated in the second pipeline based on a thermosiphon effect.

3. The device as claimed in claim 1, wherein the cross sectional constriction has a cross sectional area of between 7 mm² and 30 mm².

4. The device as claimed in claim 1, wherein the cross sectional constriction is located in a part of the first pipeline facing the superconducting switch.

5. The device as claimed in claim 1, wherein the first refrigerant circulates in the first pipeline on the basis of a thermosiphon effect.

6. The device as claimed in claim 1, wherein the first refrigerant is helium.

7. The device as claimed in claim 1, wherein the refrigerant space is part of a refrigerant piping system with refrigerant paths on the or through the at least one superconducting unit.

8. The device as claimed in claim 7, wherein the first refrigerant circulates in the refrigerant piping system based on a thermosiphon effect.

9. The device as claimed in claim 1, wherein the first refrigerant located in the refrigerant piping system is cooled by at least one cold head of the cooling plant.

10. The device as claimed in claim 9, wherein the second pipeline is thermally coupled to a cooling stage of the cold head that is at a higher temperature level than a cooling stage provided for cooling the first refrigerant.

11. The device as claimed in claim 1, wherein the second pipeline is designed to conduct heat poorly.

12. The device as claimed in claim 1, wherein the second refrigerant has a triple point above the transition temperature of the superconducting material of the switching path.

13. The device as claimed in claim 1, wherein the second refrigerant is hydrogen or neon.

14. The device as claimed in claim 1, wherein the at least one superconducting unit and the superconducting switch are arranged in a common vacuum chamber.

15. The device as claimed in claim 1, wherein the superconducting switch is a permanent current switch.

16. The device as claimed in claim 1, wherein at least one superconducting unit is an MRI magnet.

17. The device as claimed in claim 1, wherein the superconductors of the at least one superconducting unit have metallic LTC superconductor material.

18. The device as claimed in claim 1, wherein the superconductors of the at least one superconducting unit have oxidic HTC superconductor material.

19. The device as claimed in claim 1, wherein the cross sectional constriction has a cross sectional area of between 0.5 mm² and 100 mm².

* * * * *